(12) United States Patent
Edwards

(10) Patent No.: US 10,699,503 B2
(45) Date of Patent: Jun. 30, 2020

(54) APPARATUS, SYSTEM AND METHOD FOR QUICK TRANSPORT OF HOSPITAL BEDS OR AMBULANCE GURNEYS THROUGH SECURED AREAS

(71) Applicant: Joseph Edwards, Santa Rosa, CA (US)

(72) Inventor: Joseph Edwards, Santa Rosa, CA (US)

( * ) Notice: Subject to any disclaimer, the term of this patent is extended or adjusted under 35 U.S.C. 154(b) by 0 days.

(21) Appl. No.: 15/242,485

(22) Filed: Aug. 20, 2016

(65) Prior Publication Data
US 2018/0005472 A1 Jan. 4, 2018

Related U.S. Application Data

(60) Provisional application No. 62/340,526, filed on May 24, 2016.

(51) Int. Cl.
| | |
|---|---|
| *G07C 7/00* | (2006.01) |
| *H05K 7/14* | (2006.01) |
| *G07C 9/00* | (2020.01) |
| *A61G 7/05* | (2006.01) |
| *A61G 1/04* | (2006.01) |

(Continued)

(52) U.S. Cl.
CPC ....... *G07C 9/00904* (2013.01); *A47G 1/1653* (2013.01); *A61G 1/04* (2013.01); *A61G 7/05* (2013.01); *A61G 7/0503* (2013.01); *B62B 3/1408* (2013.01); *B62B 3/1412* (2013.01); *B62B 3/1416* (2013.01); *B62B 9/26* (2013.01); *G07C 7/00* (2013.01); *G07C 9/20* (2020.01); *G07C 9/22* (2020.01); *G07C 9/27* (2020.01); *G09F 1/103* (2013.01); *H05K 7/14* (2013.01); *G07C 2009/00325* (2013.01);

(Continued)

(58) Field of Classification Search
CPC .. A47G 1/1653; B62B 3/1408; B62B 3/1416; B62B 3/1424; B62B 3/1428; B62B 9/26; G07C 9/00031; G07C 9/00103; G07C 9/00182; G07C 9/00571; G09F 1/103
See application file for complete search history.

(56) References Cited

U.S. PATENT DOCUMENTS

| | | | |
|---|---|---|---|
| 5,758,902 A * | 6/1998 | McManus | B42F 9/001 281/21.1 |
| 6,422,463 B1 * | 7/2002 | Flink | G07C 9/00031 235/380 |

(Continued)

*Primary Examiner* — Dionne Pendleton
(74) *Attorney, Agent, or Firm* — Alexander Chen, Esq.

(57) ABSTRACT

Novel security clearance delivery assistance system for healthcare providers working in hospitals nationwide that improves patient care by reducing or eliminating the amount of time needlessly wasted by manually presenting security clearance smart cards to the security reader for authentication while transporting patients across hospitals. In life or death situations, which occur routinely in hospitals, quick delivery of patients to destinations such as the operating room could mean life or death. A health care professional's ability to save lives may depend in part on their ability to quickly transport patients through secured areas, which currently require the transporter to stop and authenticate at each doorway. With the likelihood of survival decreasing exponentially as time passes, reducing or eliminating interruptions during transportation will enable healthcare providers more time to perform life saving procedures and dramatically increase the likelihood of survival.

5 Claims, 9 Drawing Sheets

(51) Int. Cl.
  *G07C 9/20* (2020.01)
  *G07C 9/27* (2020.01)
  *A47G 1/16* (2006.01)
  *G09F 1/10* (2006.01)
  *B62B 3/14* (2006.01)
  *B62B 9/26* (2006.01)
  *G07C 9/22* (2020.01)

(52) U.S. Cl.
  CPC ............. *G07C 2009/00523* (2013.01); *G07C 2009/00976* (2013.01); *G07C 2209/08* (2013.01); *G07C 2209/64* (2013.01)

(56) References Cited

U.S. PATENT DOCUMENTS

| | | | | |
|---|---|---|---|---|
| 7,774,969 | B1* | 8/2010 | Silverman | H05K 5/0278 |
| | | | | 224/257 |
| 2003/0037851 | A1* | 2/2003 | Hogganvik | A45C 11/182 |
| | | | | 150/147 |
| 2005/0011981 | A1* | 1/2005 | Baumgarten | B65H 75/48 |
| | | | | 242/377 |
| 2011/0095476 | A1* | 4/2011 | Avilla | A63F 1/08 |
| | | | | 273/148 A |
| 2011/0226926 | A1* | 9/2011 | Ammann | G09F 1/103 |
| | | | | 248/479 |
| 2016/0207557 | A1* | 7/2016 | Olivieri | B62B 3/1408 |

\* cited by examiner

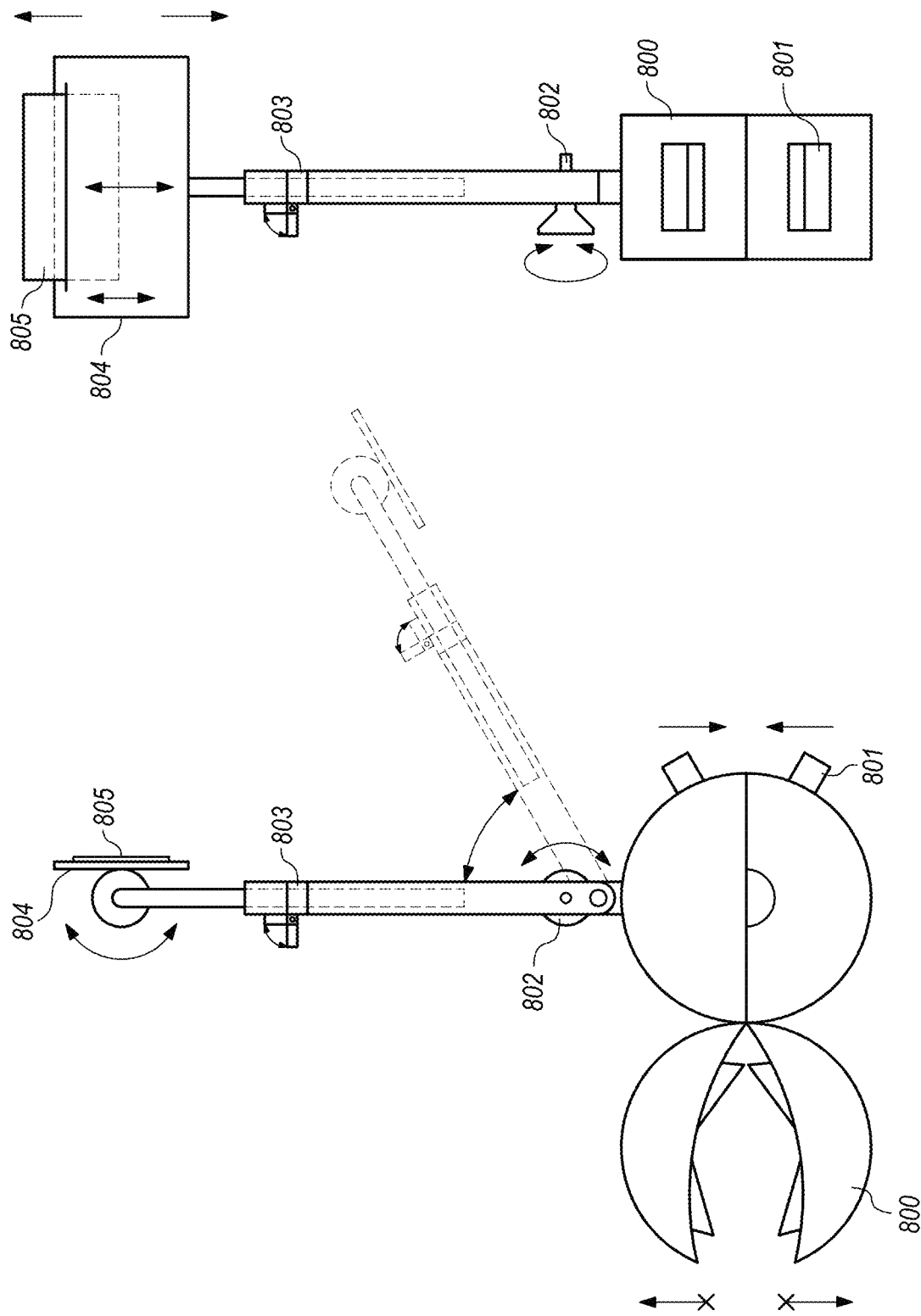

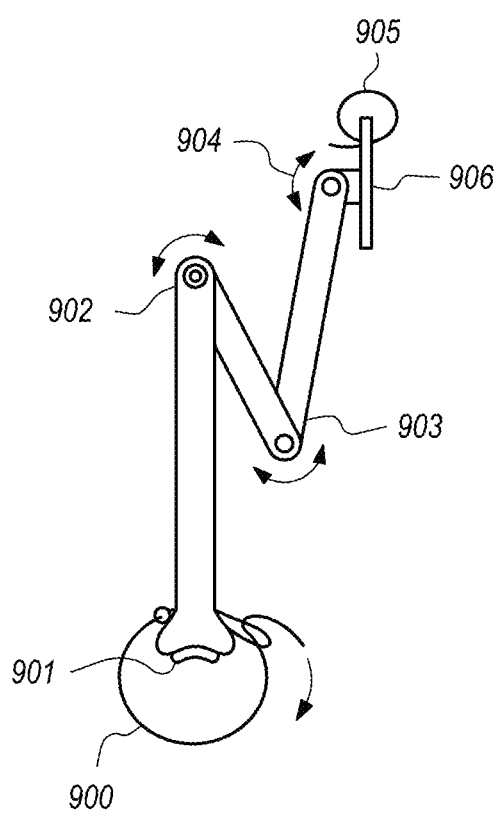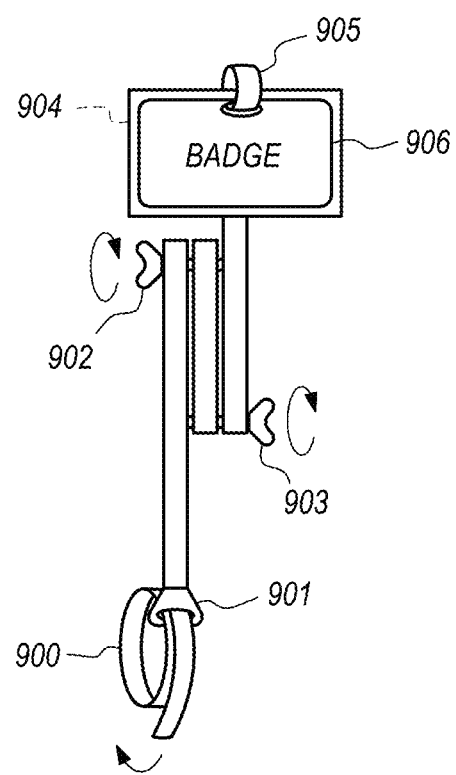
FIG. 9A
FIG. 9B

APPARATUS, SYSTEM AND METHOD FOR QUICK TRANSPORT OF HOSPITAL BEDS OR AMBULANCE GURNEYS THROUGH SECURED AREAS

INCORPORATION BY REFERENCE

This application claims the benefit of priority under 35 U.S.C. 119(e) to the filing date of U.S. provisional patent application No. 62/340,526 "Apparatus, System And Method For Quick Transport of Hospital Beds or Ambulance Gurneys Through Secured Areas" which was filed on May 24, 2016 and which are incorporated herein by reference in their entirety.

FIELD OF INVENTION

The present invention is directed generally to a system, apparatus and method of quick transport of hospital beds and ambulance gurneys through secured hospital areas.

BACKGROUND OF THE INVENTION

In every well-equipped hospital, mobile hospital beds or ambulance gurneys are essential. They are mobile so patients may be moved to different services within the hospital for necessary medical procedures. First, a patient is transported on an ambulance gurney to the hospital emergency room. Then, the patient may be transferred to a hospital bed. From there the patient might be transported to radiology for various tests such as X-rays and CT scans. As we all know, life and death emergencies occur daily at hospitals and time is of the essence. Every second counts. Thus, it is essential that the travel path of a gurney or hospital bed in such an emergency be as clear and unimpeded as possible. A matter of seconds quite literally could mean life or death for patients.

However, hospitals, like other important establishments, must maintain the safety and security of the facility, the personnel, and patrons. This is equally as vital as quickly transporting injured patients. As a result, hospitals must install locked doors and security systems to keep unauthorized persons out while allowing authorized personnel in. Because of these necessary security measures, the travel time of a gurney or bed may be significantly magnified by obliging authorized personnel to frequently pause in order to authenticate themselves at each doorway. It cannot be overstated in these tenuous circumstances that time is of the essence.

Currently, authorization at each door involves a security reader, typically installed on a wall in the vicinity of the door. Some systems utilize a magnetically charged smart card or chip embedded security card for each authorized person to wear on their person. Authorization is achieved by bringing the smart card or card within a couple inches or centimeters of the reader. The reader is then able to see the smart card and the system either authenticates or rejects it. Upon authentication, the doors are unlocked, or opened automatically.

Obviously, it takes time to scan, read and authenticate the smart card. Thus, the medical professional must stop several times to perform the required verification, wasting precious time, which by no exaggeration, could mean life or death in a large number of cases.

Furthermore, employee safety is equally as important as patient safety. Each year, hospitals pay exorbitant amounts of money due to employee injuries. Those responsible for quick and safe transport of patients are at a much higher risk of injury due to constant pushing, pulling, and stopping required by the aforementioned security measures. Hospital beds and gurneys can weigh hundreds of pounds alone, and much more when occupied by large adult men or women. The added physical strain from each stop accumulates over time and significantly increases the risk of injury, and consequently workplace injuries.

OBJECTIVE OF THE INVENTION

It is the object of this invention to significantly reduce the amount of time wasted by the required security checkpoints littered along the hospital bed or gurney's pathway. This will be accomplished by creating a device, which is universally attachable and detachable to hospital beds and gurneys, which will be extendable to any length required by the height of the installed security card reader, in order to place the card within the required proximity to be seen by the reader and consequently authenticated.

It is the object of this invention to relieve hospital personnel the burden of stopping, locating their card, placing the card next to the reader, and returning the card to their pocket or smart card clip once verified. When seconds matter, such a device could be key to saving someone's life.

It is further the object of this invention to reduce workplace injuries for employees responsible for quick and safe transport of patients. By reducing or eliminating physical strain caused by multiple stops along a patient's transport pathway, workplace risk of injury may be significantly reduced and employee safety increased.

BRIEF DESCRIPTION OF THE DRAWINGS

These and other features and advantages of the invention will not be described with reference to the drawings of certain preferred embodiments, which are intended to illustrate and not to limit the invention, and in which:

FIGS. 8A & 8B illustrate the front and side view of one embodiment of the present invention.

FIGS. 9A & 9B illustrate the front and side view of one embodiment of the present invention.

SUMMARY OF THE INVENTION

Figure 1:
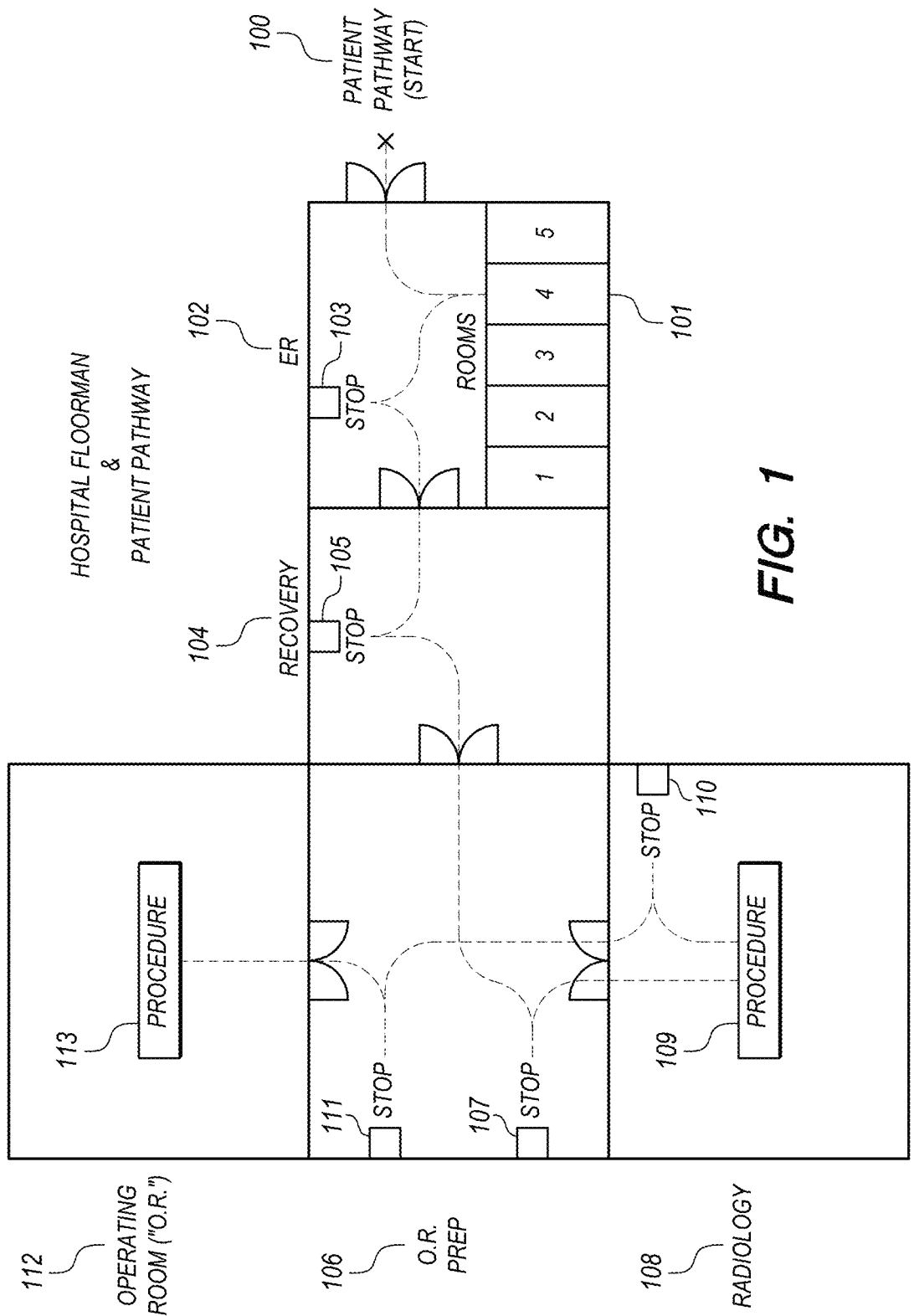
FIG. 1 is an example of one possible pathway a patient, who is lying on a gurney or bed, may take through a hospital in order to reach their destination.

In one aspect of the invention, a method for transporting patience through secured areas is disclosed comprising Installing security gate to each secured area; Installing a gate opening system to said security gate comprising a receiver and a smart card wherein said security gate opens when said smart card is in close proximity to said receiver; Installing said receiver outside said secured area along a wall; Providing a gurney or a hospital bed to transport a patient; Attaching an adjustable smart card holder to said hospital bed or to said gurney; Attach said smart card to said smart card holder; Adjust said adjustable smart card holder wherein said smart card is aligned with said receiver on the wall; Triggering the security gate to open when said gurney or said hospital bed is pushed close by said receiver wherein said smart card triggers said security gate to open. In one embodiment, the adjustable smart card holder has an extension arm wherein said extension arm changes elevation of said smart card in relation to said gurney or hospital bed. In one embodiment, said adjustable smart card holder has an extension arm holding said smart card wherein said arm can rotate 360 degrees along a radius.

In one embodiment, said adjustable smart card holder has an extension arm wherein said extension arm is a gooseneck tube. In one embodiment, said adjustable smart card holder has an extension arm wherein said extension arm is a gooseneck mount.

In another aspect of the invention, an apparatus for clamping onto a gurney or a hospital bed comprising a clamp, a movable arm wherein said movable arm is comprised of flexible gooseneck and a mounting plate to mount a smart card is disclosed. In one embodiment, the flexible gooseneck is comprised of plastic friction vertebrate. In one embodiment, the flexible gooseneck is comprised of metal tubing.

In another aspect of the invention, an apparatus for clamping onto a gurney or hospital bed comprising a smart card holder is disclosed, a mounting connector to a gurney or a hospital bed and a swing arm. In one embodiment, said mounting connector is comprised of a Velcro belt to secure said mounting connector to said hospital bed or said gurney. In one embodiment, said swing arm is comprised of at least a first arm joined to the first end of a second arm with a friction screw and the second end of said second arm joined to a $3^{rd}$ arm with a friction screw.

In another aspect of the invention, an apparatus for clamping onto a gurney or a hospital bed comprising a smart card holder, a mounting connector to said gurney or said hospital bed and a swing arm. In one embodiment, said mounting connector is comprised of a clamping structure comprising a claw and at least one internal spring wherein said internal spring exerts spring force to said claw thereby allowing said claw clamps to said gurney or said hospital bed, wherein said claw further comprises at one or more friction pads to enhance said claw's ability to grip, wherein said claws may be disengaged by applying force against said spring. In one embodiment, said swing arm is comprised a first arm section and a second arm section, wherein said first arm is slideable within inside said second arm wherein said swing arm is further comprised of a friction lock wherein said friction lock secures said first arm section against said second arm section along the entire length of said second arm. In one embodiment, said smart card holder is comprised of a rotatable plate and a clear cover comprising at least one horizontal opening large enough to allow any standard sized smart card to be inserted.

DETAILED DESCRIPTION OF THE INVENTION

In one embodiment an extendible and retractable arm apparatus will present the required smart card to the reader.

In one embodiment the arm possesses a latching mechanism, which may attach to the side rail of any variation of hospital bed or gurney.

In one embodiment the latching mechanism is composed of spring-loaded claw with friction pads to hold the arm securely to the side rail of the bed or gurney.

In one embodiment the latching mechanism is composed of Velcro band or loop with friction pads to hold the arm securely to the side rail of the bed or gurney.

In one embodiment the latching mechanism is composed of a friction lock with friction pads to hold the arm securely to the side rail of the bed or gurney.

In one embodiment the arm possesses an adjustable holding mechanism, which may securely hold various types of smart cards to be presented to the reader for authentication.

In one embodiment the holding mechanism is composed of a clear pouch with a horizontal or vertical slit, allowing the user to easily insert a smart card into the holding mechanism for safe and secure presentation to the wall-mounted smart card reader.

In one embodiment the holding mechanism is composed of a Velcro band or loop, enabling the user to secure the smart card by looping the Velcro through the hole punch-out common to smart cards, and securing the Velcro onto itself in the typical fashion, thus allowing the user to easily attach a smart card to the holding mechanism for safe and secure presentation to the wall-mounted smart card reader.

In one embodiment the holding mechanism is composed of a two friction trays, a top tray and bottom tray, allowing the user to easily insert a smart card into the holding mechanism for safe and secure presentation to the wall-mounted smart card reader.

In one embodiment the arm is extendible, allowing the user to adjust the height of the smart card to the same height as the reader.

In one embodiment the arm is extendible using two individual arms in which one slides freely inside the other, allowing the user to adjust the height of the smart card to the same height as the reader.

In one embodiment the arm is extendible using additional joints in which each joint may be tightened or loosened, locking or unlocking the arms in place, allowing the user to adjust the height of the smart card to the same height as the reader.

In one embodiment the arm is adjustable by using multiple friction-locking vertebrae comprising one long arm, allowing the user to adjust the position of the smart card to the same position as the reader.

DETAILED DESCRIPTION OF THE DRAWINGS

The invention will be described in the context of a preferred embodiment.

Referring to FIG. 1, this illustrates a sample hospital floor plan and one potential pathway any given patient may follow. Here a patient enters the hospital 100 through the Emergency Room ("ER") 102 on a gurney. The patient is admitted to the ER 102 and assigned to room four 101. The patient is then transferred to a hospital bed whereupon the doctor orders a procedure 109 to be performed in radiology 108 on the opposite side of the hospital. A technician then transports the patient. He must first stop at the ER card reader 103 to present his security clearance and is admitted to recovery 104. He then travels through recovery 104 to reach the O.R. Prep card reader 105 where he is once again stopped to present his security clearance. Once admitted to O.R. Prep 106 he must then approach the Radiology card reader 107 to present his security clearance. Once admitted to Radiology 108, the procedure is performed 109. Procedures may include X-rays, CT scans, or MRI's. Once completed, the scan reveals the patient's appendix has previously ruptured and must immediately undergo emergency surgery in the O.R. 112 as he has only minutes to live. The technician must then rush the patient to the O.R. 112. But first, he must stop and the O.R. Prep card reader 110 to request clearance. Once granted, he must once again stop at the O.R. card reader 107 before finally being admitted to the operating room for the life-saving procedure 113. This illustration of a patient pathway through a simple hospital is very common. The procedures may differ per patient but the required security checks at each doorway does not differ between patients and the added delay may endanger the patient's life.

Figure 2:
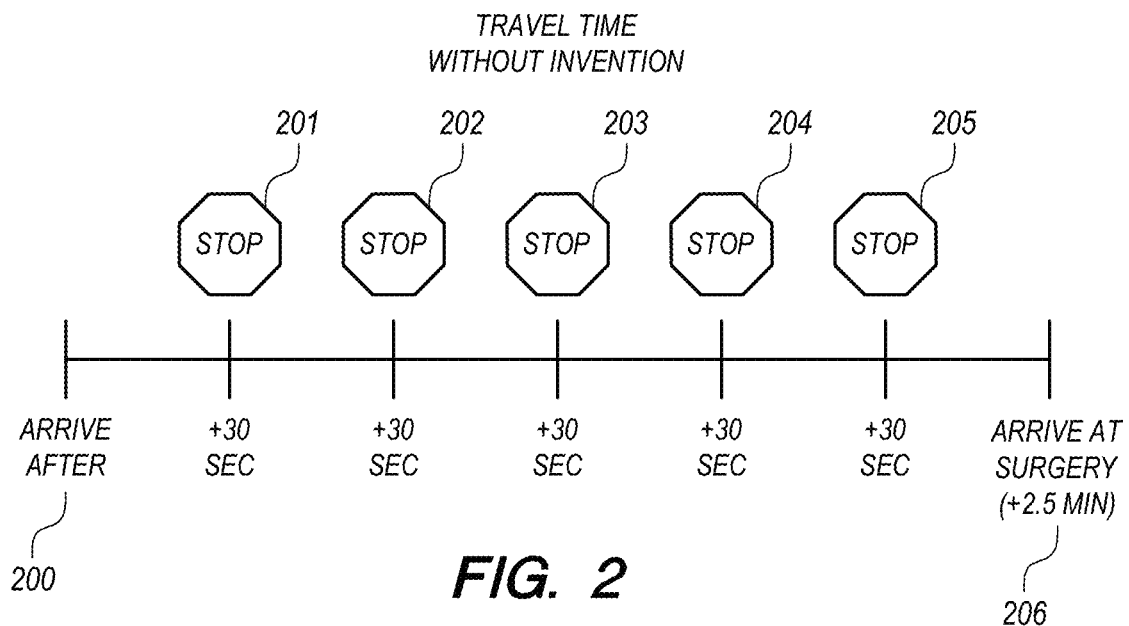
FIG. 2 is an example of the potential added time current security measures may add to a patient's travel time from their arrival in the ER to the Operating Room.

Referring to FIG. 2, this illustrates additional travel time accumulated at each card reader of the previously illustrated patient pathway from the ER to Radiology to the OR. Here the patient arrives at the ER 200 and is admitted. No security clearance is required at this point. Next he must enter Recovery, which requires him to stop 201 to present his smart card to the card reader adding 30 seconds to the patient's travel time. Next he must travel through Recovery to OR Prep where he once again must stop 202 to present his smart card to the card reader adding another 30 seconds. Once admitted, he must stop again 203 to scan his smart card adding 30 seconds. Following radiology's procedure he must stop 204 once again to scan his smart card to enter O.R. Prep, again adding another 30 seconds. Next, to enter the operating room he must stop 205 to present his smart card adding another 30 seconds. In this example, the total added travel time due to the required stops at each doorway to manually present a smart card equals 2 minutes 30 seconds. For a patient such as the one illustrated, whose appendix has previously ruptured, this amount of additional time may be fatal.

Figure 3:
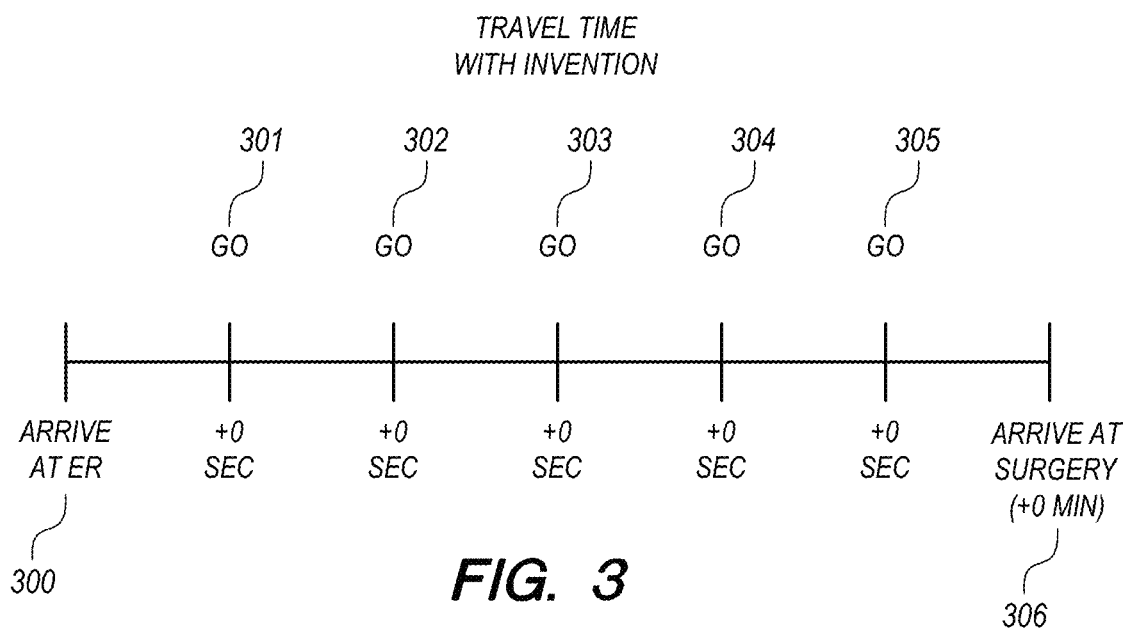
FIG. 3 is an example of the potential added time current security measures may add to a patient's travel time from their arrival in the ER to the Operating Room while utilizing the present invention.

Referring to FIG. 3, this illustrates additional travel time accumulated at each card reader of the previously illustrated patient pathway from the ER 300 to Radiology to the OR 306 while using the present invention. Here the patient arrives at the ER 300 and is admitted. No security clearance is required at this point. Next he must enter Recovery, which requires him to stop 301 to present his smart card to the card reader. However, the current invention presents the smart card autonomously, adding 0 seconds to the patient's travel time and allowing him to continue uninterrupted. Next, he must travel through Recovery to OR Prep where he once again must stop 302 to present his smart card to the card reader. However, the current invention presents the smart card autonomously, adding 0 seconds to the patient's travel time and allowing him to continue uninterrupted. Once admitted, he must stop again 303 to scan his smart card. However, the current invention presents the smart card autonomously, adding 0 seconds to the patient's travel time and allowing him to continue uninterrupted. Following radiology's procedure he must stop 304 once again to scan his smart card to enter O.R. Prep. However, the current invention presents the smart card autonomously, adding 0 seconds to the patient's travel time and allowing him to continue uninterrupted. Next, to enter the operating room 306 he must stop 305 to present his smart card. However, the current invention presents the smart card autonomously, adding 0 seconds to the patient's travel time and allowing him to continue uninterrupted. In this example, the total added travel time due to the required stops at each doorway is reduced to 0 additional seconds. In other words, the present invention has saved 2 minutes and 30 seconds that otherwise would have been needlessly wasted. For a patient whose appendix has previously ruptured, this amount of saved time may be life saving.

Figure 4:
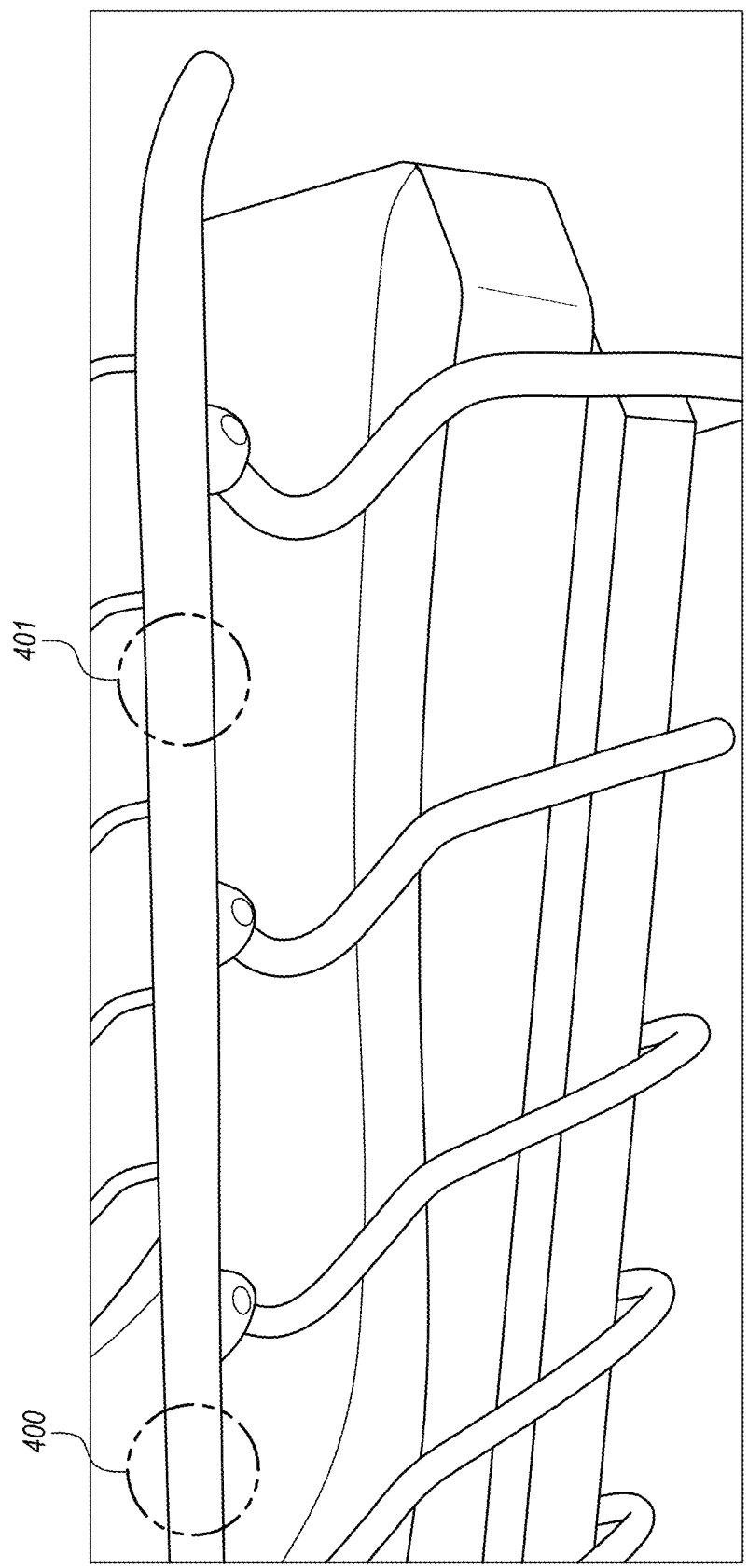
FIG. 4 is an example of a hospital gurney.

Referring to FIG. 4, this illustrates one type of ER gurney that may be used in hospitals throughout the country. Each one has safety side rails. The present invention may attach to these side rails, near the head 400 for example or near the feet 401.

Figure 5:
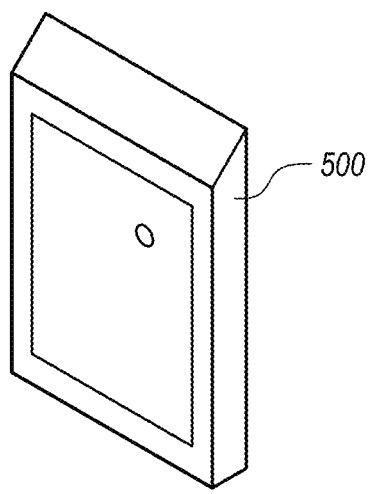
FIG. 5 is an example of a hospital smart card reader.

Referring to FIG. 5, this illustrates the most common form of card reader among hospitals 500. Typically the smart card is placed within a few inches of the reader to be properly authorized. Current methods require the employee to stop and manually hold the reader within the previously mentioned proximity. However, the current invention is designed to accomplish this task autonomously.

Figure 6:
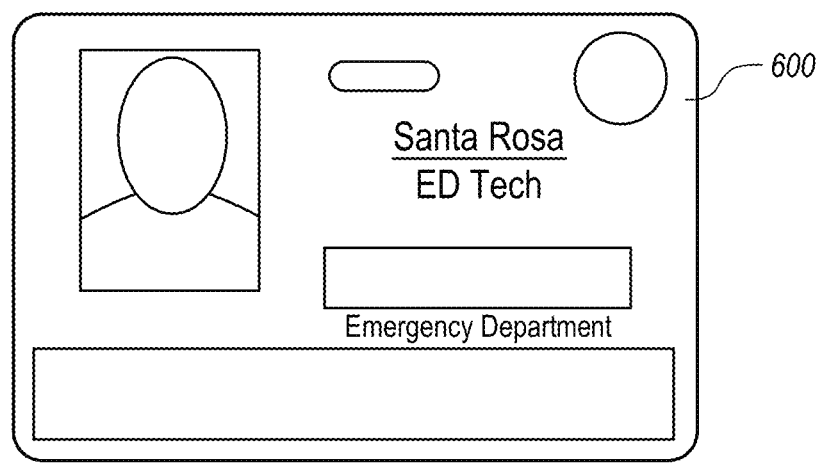
FIG. 6 is an example of a hospital smart card.

Referring to FIG. 6, this illustrates the most common form of smart card used in hospitals nationwide. Embedded within the card is a magnetic chip 600 that communicates with the card reader from a short distance.

Figure 7:
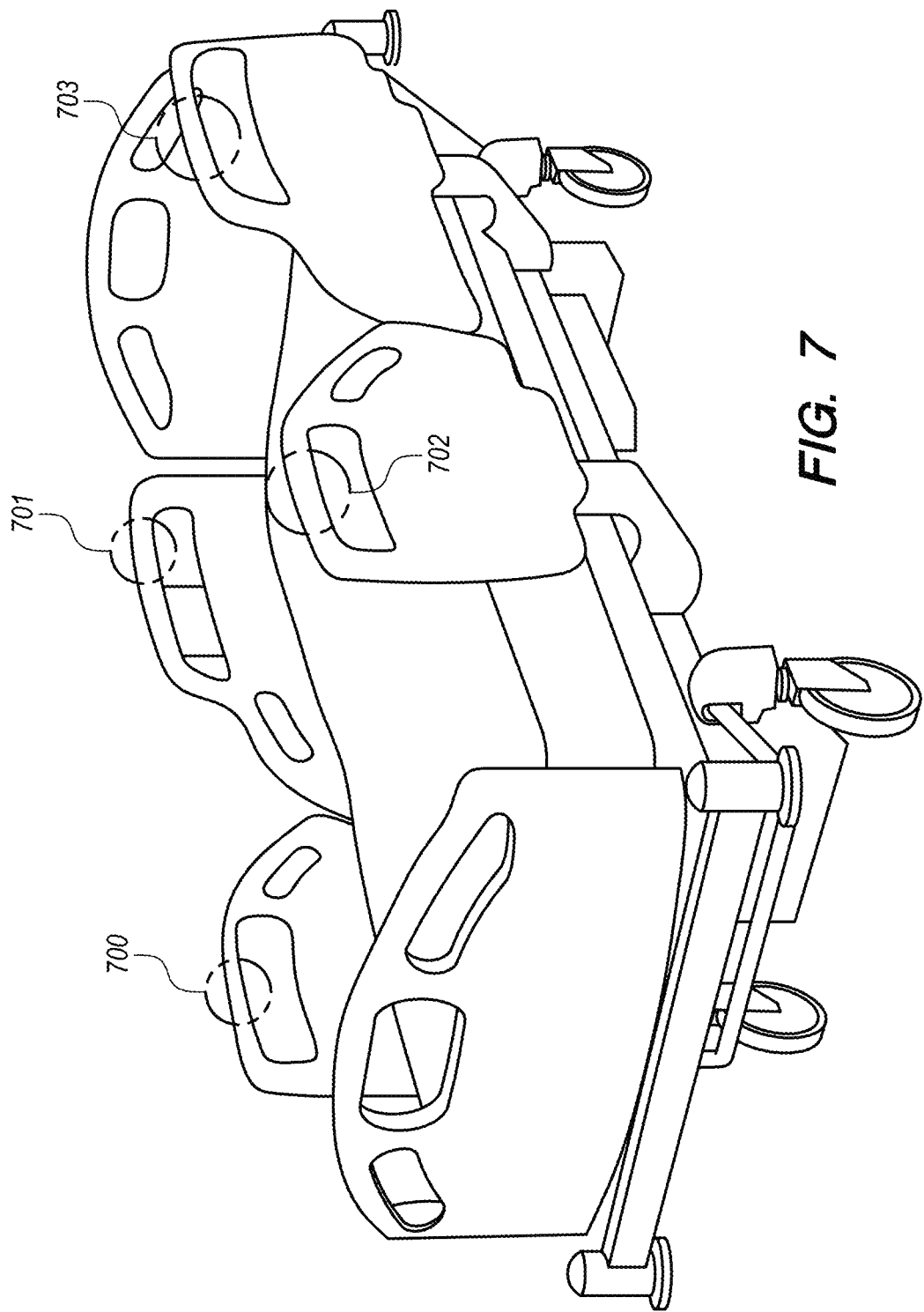
FIG. 7 is an example of a hospital bed.

Referring to FIG. 7, this illustrates the most common type of hospital bed used nationwide. Each one contains several safety side rails, as illustrated, with several various hand rails throughout the design. These handholds 700, 701, 702, 703 are a few examples of locations where the present invention may be installed.

Referring to FIGS. 8A and 8B, these illustrate one embodiment of the present invention. Here, the latching mechanism is composed of spring-loaded claws 800 with built in friction pads that are utilized by clasping the counter levers 801, consequently opening the claws and allowing the device to be clasped around hand rails or safety rails of any size. The extension arm is attached to the latching mechanism by a rotatable friction screw lock 802. The arm is comprised of another smaller arm, which slides freely inside the larger one allowing the arm to be extended to a finite length and which may be locked in place by a locking clamp 803. The holding mechanism is attached to the smaller arm by another rotatable friction screw lock 804. The holding mechanism allows for one smart card to be inserted into a clear pouch attached to a hard plastic back plate with a horizontal opening greater than the width of a common smart card 805.

Referring to FIGS. 9A and 9B, these illustrate one embodiment of the present invention. Here, the latching mechanism is composed of a Velcro belt 900 that is wrapped around the handrail or safety rail, goes through a belt loop, and attaches back onto itself 900. The base of the latching mechanism is lined with friction pads 901 to allow for a secure hold of the handrail or safety rail without slipping. The arm is composed of multiple arms, connected by friction screw locks 902, 903, which allow the arm to be extended to a finite length and locked in place. The holding mechanism is attached to the arm by another friction screw lock 904 allowing for rotation of the holding mechanism. The holding mechanism is composed of a plastic back plate and another Velcro belt 905, which is threaded through the hole punch of a standard security card, and attached back onto itself as illustrated, thus securely holding the security card for presentation to the card reader.

Figure 10A:
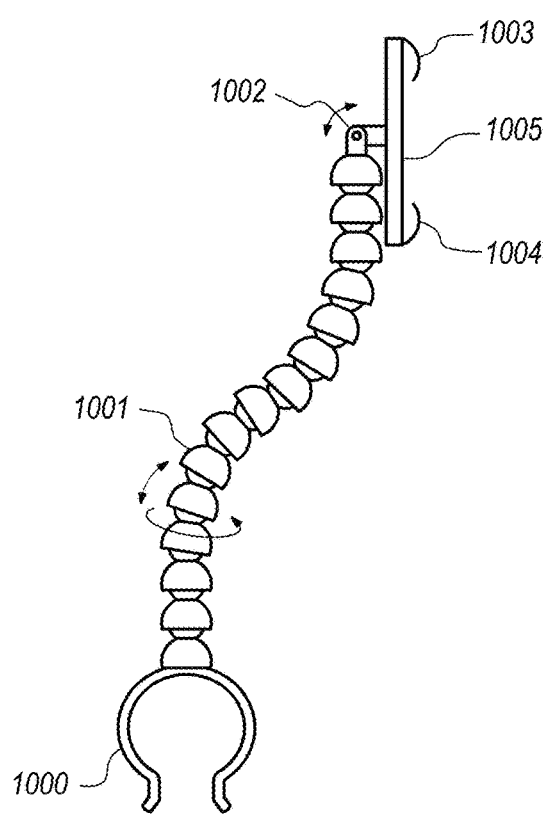
FIGS. 10A & 10B illustrate the front and side view of one embodiment of the present invention.
Figure 10B:
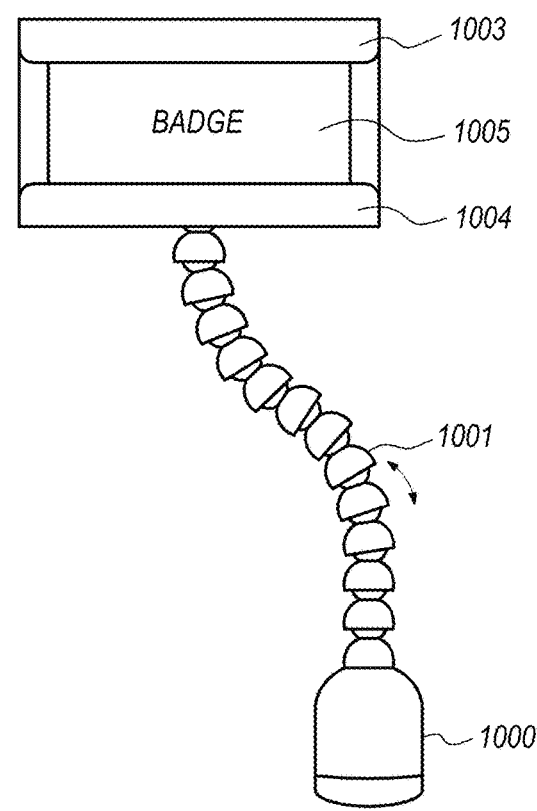

Referring to FIGS. 10A and 10B, these illustrate one embodiment of the present invention. Here, the latching mechanism is composed of a friction clasp with interior friction pads 1000. The friction clasps are designed to be smaller than the standard handrail and safety rail but flexible enough to be forced around them. The resulting resistance will securely attach the device by creating friction between the latching mechanism and the bed or gurney side rail. The arm is composed of multiple friction locking vertebrae 1001, which are loose enough to allow adjustment but stiff enough to lock in position. The holding mechanism is attached to the arm by a friction screw lock 1002 allowing for rotation of the holding mechanism. The holding mechanism is composed of a plastic back plate 1005 and two friction lips, a top 1003 and a bottom 1004. The smart card is inserted into the holding device from either the left or right sides and is held in place by the friction lips, thus securely holding the security card for presentation to the card reader.

Figure 11A:
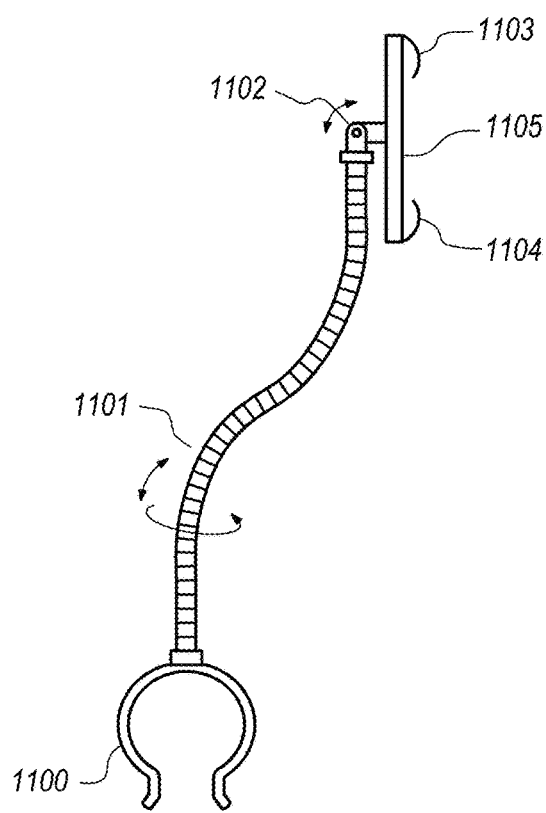
FIGS. 11A & 11B illustrate the front and side view of one embodiment of the present invention.
Figure 11B:
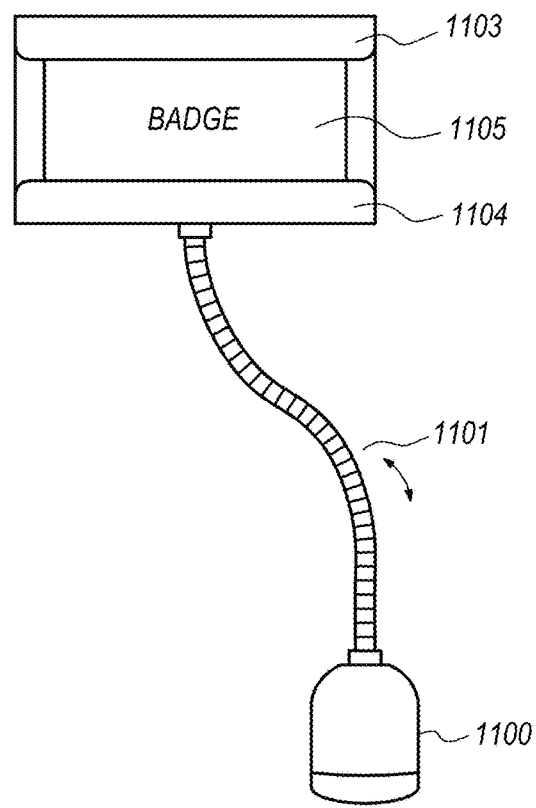

Referring to FIGS. 11A and 11B, these illustrate one embodiment of the present invention. Here, the latching mechanism is composed of a friction clasp with interior friction pads 1100. The friction clasps are designed to be smaller than the standard handrail and safety rail but flexible enough to be forced around them. The resulting resistance will securely attach the device by creating friction between the latching mechanism and the bed or gurney side rail. The arm is composed of multiple metal friction locking vertebrae 1101, commonly known as a metal gooseneck, which are loose enough to allow adjustment but stiff enough to lock in position. The holding mechanism is attached to the arm by a friction screw lock 1102 allowing for rotation of the holding mechanism. The holding mechanism is composed of a plastic back plate 1105 and two friction lips, a top 1103 and a bottom 1104. The smart card is inserted into the holding device from either the left or right sides and is held in place by the friction lips, thus securely holding the security card for presentation to the card reader.

The embodiments of the invention in which an exclusive property or privilege is claimed are defined as follows:

1. A method for transporting a patient through secured areas comprising:
 a. Installing security gate to each secured area;
 b. Installing a gate opening system to said security gate comprising a receiver and a smart card wherein said security gate opens when said smart card is in close proximity to said receiver;
 c. Installing said receiver outside said secured area along a wall;
 d. Providing a gurney or a hospital bed to transport a patient;
 e. Attaching an adjustable smart card holder to said hospital bed or to said gurney;
 f. Attach said smart card to said smart card holder;
 g. Adjust said adjustable smart card holder wherein said smart card is aligned with said receiver on the wall; and
 h. Triggering the security gate to open when said gurney or said hospital bed is pushed close by said receiver wherein said smart card triggers said security gate to open;
 wherein said smart card holder comprises at least one counter lever and at least one spring-loaded claw that in turn comprises at least one friction pad;
 wherein said smart card holder further comprises an arm that comprises at least two arm sections that are joined by frictional screw locks.

2. The method of claim 1 wherein said adjustable smart card holder has an extension arm wherein said extension arm changes elevation of said smart card in relation to said gurney or hospital bed.

3. The method of claim 1 wherein said adjustable smart card holder has an extension arm holding said smart card wherein said arm can rotate 360 degrees along a radius.

4. The method of claim 1 wherein said adjustable smart card holder has an extension arm wherein said extension arm is a gooseneck tube.

5. The method of claim 1 wherein said adjustable smart card holder has an extension arm wherein said extension arm is a gooseneck mount.

* * * * *